(12) United States Patent
Ricketson

(10) Patent No.: US 7,493,689 B2
(45) Date of Patent: Feb. 24, 2009

(54) HEAD ASSEMBLY FOR CHIP MOUNTER

(75) Inventor: Tommy Howard Ricketson, Dublin, PA (US)

(73) Assignee: Samsung Techwin Co., Ltd., Changwon (KR)

( * ) Notice: Subject to any disclaimer, the term of this patent is extended or adjusted under 35 U.S.C. 154(b) by 250 days.

(21) Appl. No.: 11/474,632

(22) Filed: Jun. 26, 2006

(65) Prior Publication Data

US 2007/0119143 A1 May 31, 2007

(30) Foreign Application Priority Data

Nov. 10, 2005 (KR) .................. 10-2005-0107609

(51) Int. Cl.
*B23P 19/00* (2006.01)
(52) U.S. Cl. .......................... 29/739; 29/743
(58) Field of Classification Search ............. 29/739–41, 29/564, 564.1
See application file for complete search history.

(56) References Cited

U.S. PATENT DOCUMENTS

| | | | | |
|---|---|---|---|---|
| 4,706,379 A | * | 11/1987 | Seno et al. ............ | 29/740 |
| 5,060,366 A | * | 10/1991 | Asai et al. ............ | 29/739 |
| 5,497,983 A | * | 3/1996 | Fujioka ............ | 269/155 |
| 5,588,195 A | * | 12/1996 | Asai et al. ............ | 29/33 M |
| 5,832,597 A | * | 11/1998 | Yokoyama et al. ...... | 29/837 |
| 6,094,808 A | * | 8/2000 | Mimura et al. ........ | 29/743 |
| 6,154,954 A | * | 12/2000 | Seto et al. ............ | 29/740 |
| 6,195,878 B1 | * | 3/2001 | Hata et al. ............ | 29/832 |
| 6,216,336 B1 | * | 4/2001 | Mitsushima et al. .... | 29/740 |
| 6,230,393 B1 | * | 5/2001 | Hirano et al. ........ | 29/740 |
| 6,412,166 B1 | * | 7/2002 | Inaba et al. .......... | 29/741 |
| 6,490,784 B1 | * | 12/2002 | Kano et al. .......... | 29/740 |
| 6,539,622 B2 | * | 4/2003 | Hidese et al. ........ | 29/832 |
| 6,553,659 B1 | * | 4/2003 | Ida et al. ............ | 29/840 |
| 6,634,093 B1 | * | 10/2003 | Lee .................. | 29/740 |
| 6,662,438 B2 | * | 12/2003 | Suhara et al. ........ | 29/743 |
| 6,691,401 B2 | * | 2/2004 | Hata et al. .......... | 29/743 |
| 6,725,532 B1 | * | 4/2004 | Okada et al. ........ | 414/752.1 |
| 6,729,018 B1 | * | 5/2004 | Takano et al. ........ | 29/743 |
| 6,739,036 B2 | * | 5/2004 | Koike et al. ........ | 29/743 |
| 6,769,172 B2 | * | 8/2004 | Suhara et al. ........ | 29/740 |
| 6,862,803 B2 | * | 3/2005 | Kawase et al. ........ | 29/832 |
| 6,952,869 B2 | * | 10/2005 | Suhara et al. ........ | 29/740 |
| 6,961,994 B2 | * | 11/2005 | Terada et al. ........ | 29/833 |
| 6,971,157 B1 | * | 12/2005 | Yoshida et al. ........ | 29/739 |

(Continued)

FOREIGN PATENT DOCUMENTS

JP 2002-009491 A 1/2002

(Continued)

*Primary Examiner*—David P Bryant
*Assistant Examiner*—David P Angwin
(74) *Attorney, Agent, or Firm*—Drinker Biddle & Reath LLP

(57) ABSTRACT

A head assembly for a chip mounter is provided. The head assembly includes: a housing having a plurality of spindle receiving holes; nozzle spindles that are fitted with nozzles picking up and mounting electronic components and vertically movably inserted into the spindle receiving holes; a selection member selecting at least one of the nozzle spindles and vertically moving the selected nozzle spindle; a horizontal driver horizontally moving the selection member and changing a nozzle spindle to be selected; and an elevating driver vertically moving the selection member.

22 Claims, 14 Drawing Sheets

U.S. PATENT DOCUMENTS

| | | | |
|---|---|---|---|
| 7,021,357 B2 * | 4/2006 | Katano et al. | 156/556 |
| 7,043,820 B2 * | 5/2006 | Suhara | 29/564.1 |
| 7,043,824 B2 * | 5/2006 | Suhara et al. | 29/740 |
| 7,185,422 B2 * | 3/2007 | Sakai et al. | 29/832 |
| 7,213,332 B2 * | 5/2007 | Inoue et al. | 29/840 |
| 7,302,755 B2 * | 12/2007 | Ricketson | 29/743 |
| 7,325,298 B2 * | 2/2008 | Kobayashi et al. | 29/740 |
| 7,337,533 B2 * | 3/2008 | Imafuku et al. | 29/739 |

FOREIGN PATENT DOCUMENTS

JP 2003-273582 A 9/2003

\* cited by examiner

3rd POSITION

4th POSITION

HEAD ASSEMBLY FOR CHIP MOUNTER

CROSS-REFERENCE TO RELATED PATENT APPLICATION

This application claims the benefit of Korean Patent Application No. 10-2005-0107609, filed on Nov. 10, 2005, in the Korean Intellectual Property Office, the disclosure of which is incorporated herein in its entirety by reference.

BACKGROUND OF THE INVENTION

1. Field of the Invention

The present invention relates to a head assembly for a chip mounter, and more particularly, to a head assembly for a chip mounter including a nozzle spindle for automatically mounting electronic components such as integrated circuits (ICs), diodes, condensers, and resistors on a printed circuit board (PCB).

2. Description of the Related Art

A chip mounter is one part of a component mounting assembly for mounting components on a PCB. The chip mounter transfers components supplied by a component feeder to a mounting position of a PCB and mounts the components on the PCB.

Typically, the chip mounter includes a component feeder feeding components to be mounted, a conveyor transferring a PCB, and a head assembly with a nozzle spindle sequentially picking-up electronic components from the component feeder and mounting the picked-up electronic components onto the PCB.

Recently, a plurality of columns of nozzle spindles have been installed in a line within a head assembly to increase component mounting efficiency. That is, the plurality of nozzle spindles sequentially or simultaneously pick up a plurality of electronic components, simultaneously transfer the plurality of picked-up electronic components to a conveyor, and sequentially or simultaneously mount the electronic components on a PCB disposed on the conveyor.

FIG. 1 illustrates a head assembly 9 for an electronic component mounting apparatus disclosed in Japanese Laid-open Publication No. 2002-009491. Referring to FIG. 1, the head assembly 9 includes a nozzle unit 12, elevating axis members 30 arranged in two parallel columns, and nozzles 38 that are disposed below the elevating axis members 30 and which pick up the electronic components.

Upper and lower frames 15 and 16 are fixed to the side of a base 11 and nozzle elevating motors 20 are vertically arranged on the upper frame 15.

To raise and lower one of the elevating axis members 30, rotation of a nozzle elevating motor 20 is transferred to an elevating element 25, which converts the rotational motion of the nozzle elevating motor 20 into a vertical motion of the elevating axis members 30. Thus, a plurality of nozzles can be vertically moved independently, which is possible by independently controlling the nozzle elevating motors 20 by a controller (not shown).

As illustrated in FIG. 1, because a separate nozzle elevating motor 20 is needed to vertically move each of the elevating axis members 30, a separate controller should be provided for each motor 20. Furthermore, the plurality of elevating elements 25 correspond to the plurality of elevating axis members 30 in a 1:1 relationship. Because this configuration increases the overall weight of head assembly 9, the component mounting speed decreases and the electrical power required for moving the head assembly 9 increases. Thus, it is extremely difficult to achieve high-speed, high-precision mounting.

As a mechanism for vertically moving each of the elevating axis members 30 becomes complicated, the manufacturing costs and price of the electronic components increase and the head assembly 9 becomes bulky.

As the demand for high speed electronic component mounting apparatus increases, the number of elevating axis members 30 installed within the head assembly 9 increases. Thus, the above-mentioned problems become more severe and the number of nozzles that can be used is limited.

Meanwhile, as disclosed in the Japanese Laid-open Publication No. 2002-009491, a pulley device may be used to rotate the nozzles. Referring to FIGS. 1 and 2, the head assembly 9 has a first line of four nozzles L1 and a second line of four nozzles L2 arranged along one direction and a nozzle rotating motor 50 mounted between the first and second lines of nozzles L1 and L2. Thus, rotation of each nozzle by the nozzle rotating motor 50 is transferred through one of two upper and lower continuously variable belts 51a and 51b provided corresponding to pulleys on an axis rotator 32 so that each line of nozzles can rotate by the nozzle rotating motor 50.

In this case, referring to FIG. 3, the axis rotator 32 includes driving pulley units 33a and idle pulley units 34a and 34b. Type "A", "B", "C", and "D" combinations of the driving pulley and idler pulley allow the of continuously variable belts 51a and 51b to contact the driving pulley unit 33a mounted on each axis of a line of nozzles to be rotated while permitting the axis rotator 32 on the other line of nozzles to be used as a belt guiding idler. The type "A" combination consists of the driving pulley unit 33a and idle pulley 34b with a bearing 34a at upper and lower portions of the axis rotator 32. The type "B" combination consists of the driving pulley unit 33a and the bearing 34a at upper and lower portions of the axis rotator 32. The type "C" combination has the bearing 34a and the driving pulley unit 33a at the upper and lower portions of the axis rotator 32. The type "D" combination has the idler pulleys 34b with the bearings 34a and the driving pulleys unit 33a at upper and lower portions of the axis rotator 32.

However, a conventional electronic component mounting apparatus uses various types of combinations of pulleys to rotate one nozzle. Types of combinations should be changed to rotate another nozzle. This complicates a mechanism for rotating a nozzle and increases time required for mounting components and the overall weight of head assembly.

Furthermore, because the head assembly uses a belt to rotate the nozzle, the belt may backlash. Due to the backlash, the component cannot be accurately positioned for mounting on the PCB since the nozzle cannot rotate to a position optimally set.

SUMMARY OF THE INVENTION

The present invention provides a head assembly for a chip mounter having simple horizontal driver and elevating driver selecting a nozzle spindle and moving upward or downward the selected nozzle spindle and with a small number of components.

The present invention also provides a head assembly for a chip mounter with no backlash and which has a simple, lightweight rotator for rotating a plurality of nozzle spindles.

According to an aspect of the present invention, there is provided a head assembly for a chip mounter including: a housing having a plurality of spindle receiving holes; nozzle spindles that are fitted with nozzles picking up and mounting electronic components and vertically movably inserted into the spindle receiving holes; a selection member selecting at least one of the nozzle spindles and vertically moving the selected nozzle spindle; a horizontal driver horizontally moving the selection member and changing a nozzle spindle to be selected; and an elevating driver vertically moving the selection member. The selected nozzle spindles may include at least two front and two rear parallel nozzle spindles. The horizontal driver moves the selection member such that the selection member can select each individual nozzle spindle, at least two of the front nozzle spindles at a time, or at least two of the rear nozzle spindles at a time. In this case, the horizontal driver may rotate the selection member about the center of a polygon formed by virtual lines connecting the spindle receiving holes.

Alternatively, the head assembly for a chip mounter may include: a housing having a plurality of spindle receiving hole groups, each group including a plurality of spindle receiving holes; a plurality of nozzle spindle groups arranged corresponding to the plurality of spindle receiving hole groups, each nozzle spindle group having a plurality of nozzle spindles that are fitted with nozzles picking up and mounting electronic components and inserted into the spindle receiving holes; a plurality of selection members disposed corresponding to the plurality of nozzle spindle groups, each selection member selecting at least one spindle nozzle within the corresponding nozzle spindle group and moving upward or downward the selected nozzle spindle while it vertically moves; a plurality of horizontal drivers, each horizontally moving the corresponding selection member in such a way as to change the nozzle spindle being selected; and an elevating driver simultaneously moving upward or downward the selection member.

The horizontal driver may move the selection member so that the selection member cannot select any one of the nozzle spindles. In this case, each nozzle spindle group includes at least two front and two rear nozzle spindles. The horizontal driver can move the selection member to a first position where the selection member individually selects each nozzle spindle, a second position where the selection member selects no nozzle spindle, a third position where the selection member simultaneously select at least two front nozzle spindles, or a fourth position where the selection member simultaneously selects at least two rear nozzle spindles. At least one of distances between each of the front nozzle spindles and each of the rear nozzle spindles disposed directly behind the front nozzle spindle may be large such that the selection member cannot select any one of the front and rear nozzle spindles. The second position may be a position where the selection member is located between the front and rear nozzle spindles.

The present invention provides a compact, lightweight head assembly with no backlash and which can achieve low manufacturing costs and high-speed movement.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

Figure 1:
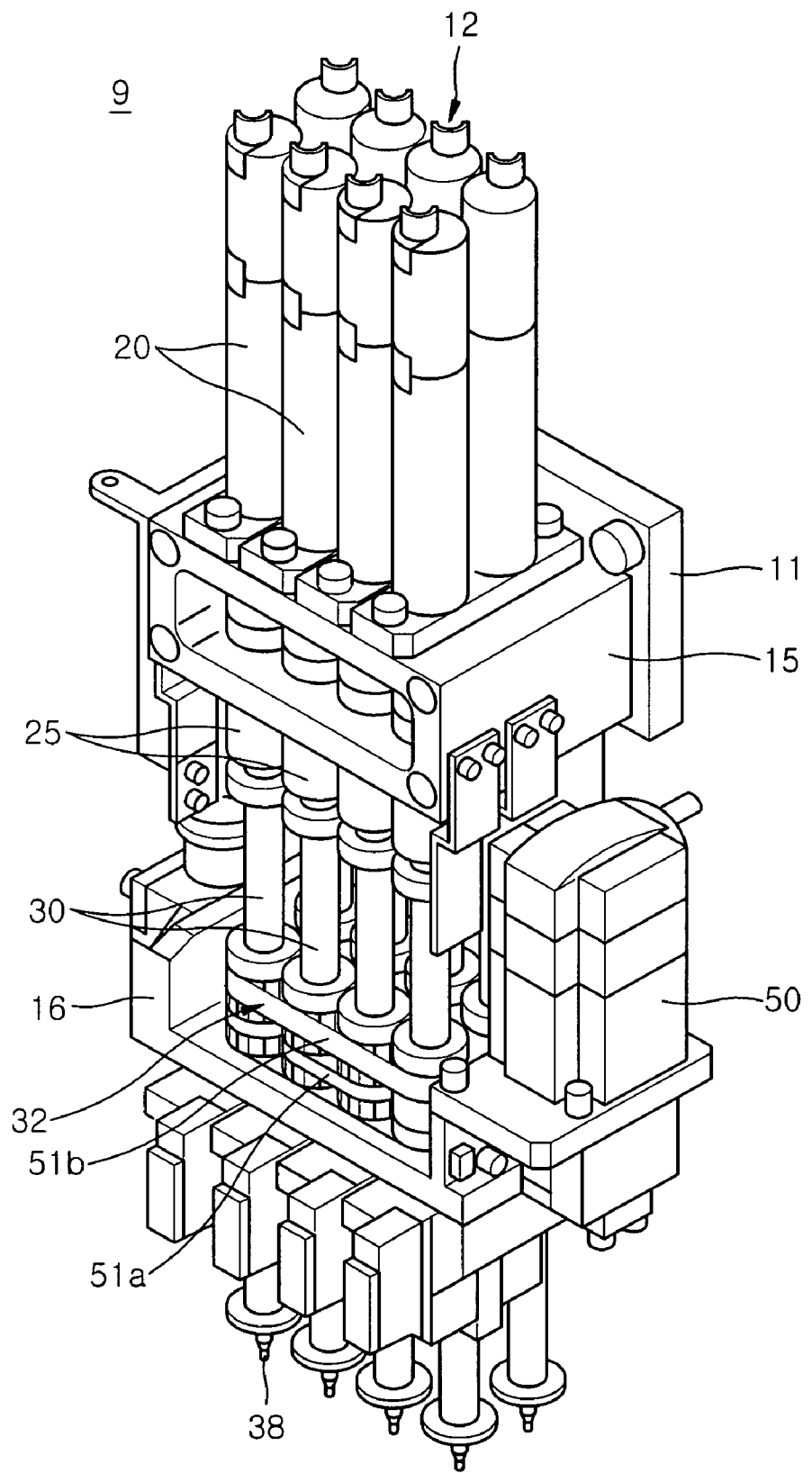
FIG. 1 is a perspective view of a conventional head assembly for an electronic component mounting apparatus.
Figure 2:
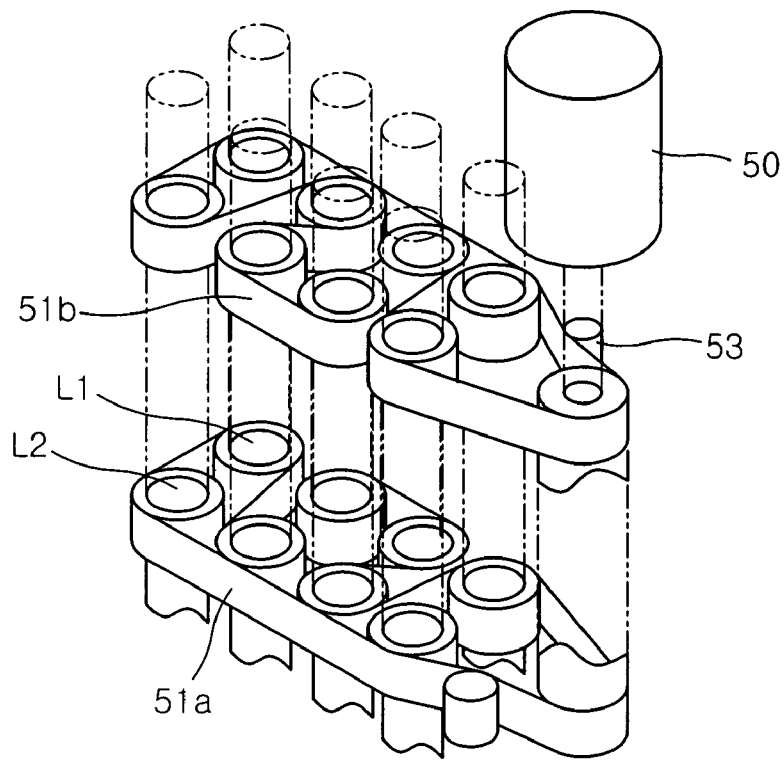
FIG. 2 is a perspective view of a mechanism for rotating the nozzle spindle shown in FIG. 1.
Figure 3:
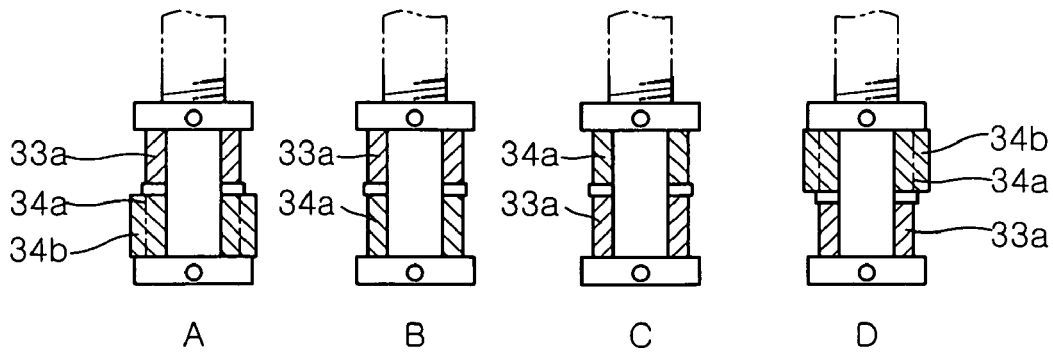
FIG. 3 is a cross-sectional view illustrating four types of combinations of driving pulley and idle pulley mounted on the axis rotator shown in FIG. 2.
Figure 4:
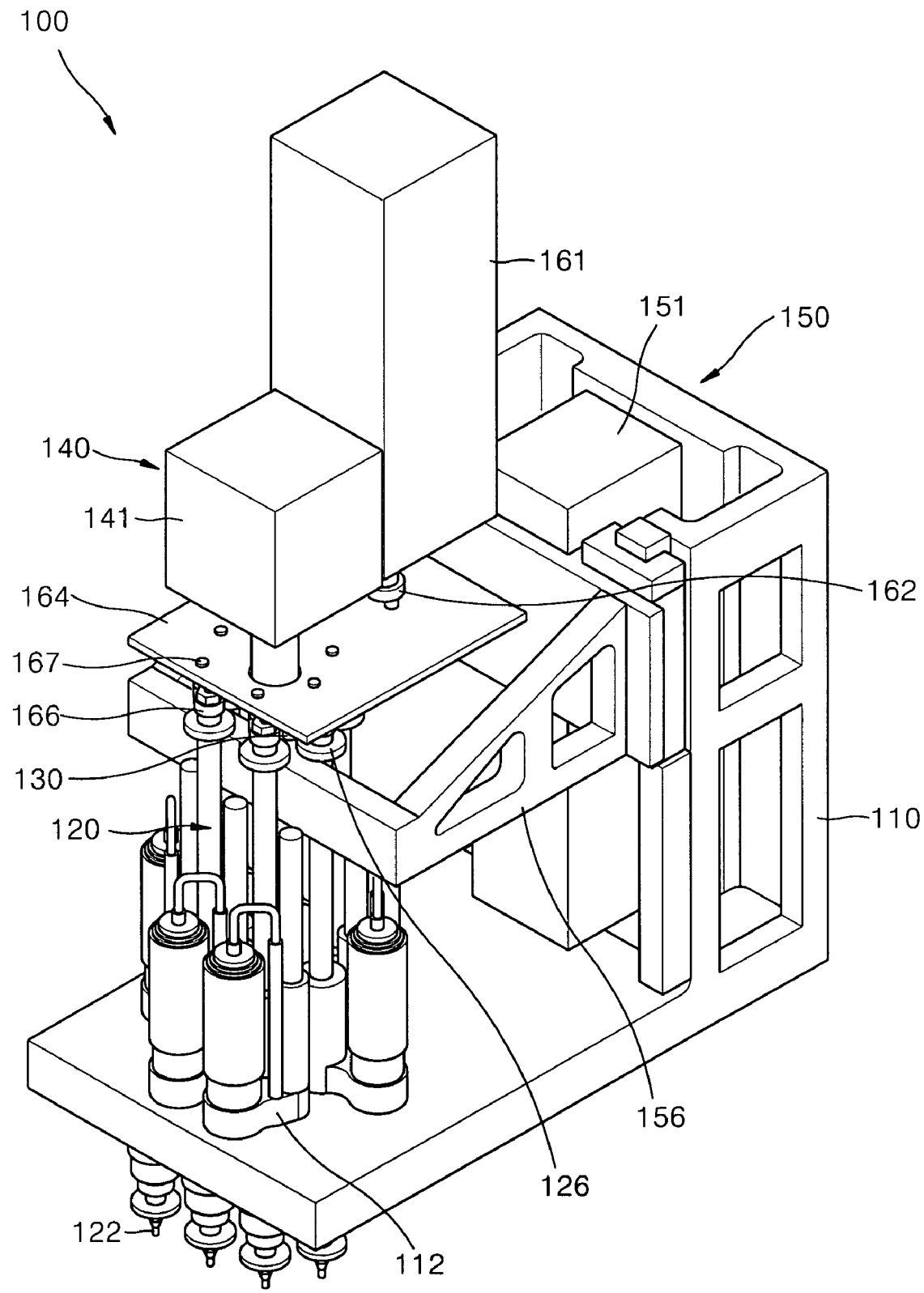
FIG. 4 is a perspective view of a head assembly for a chip mounter according to an embodiment of the present invention.
Figure 5:
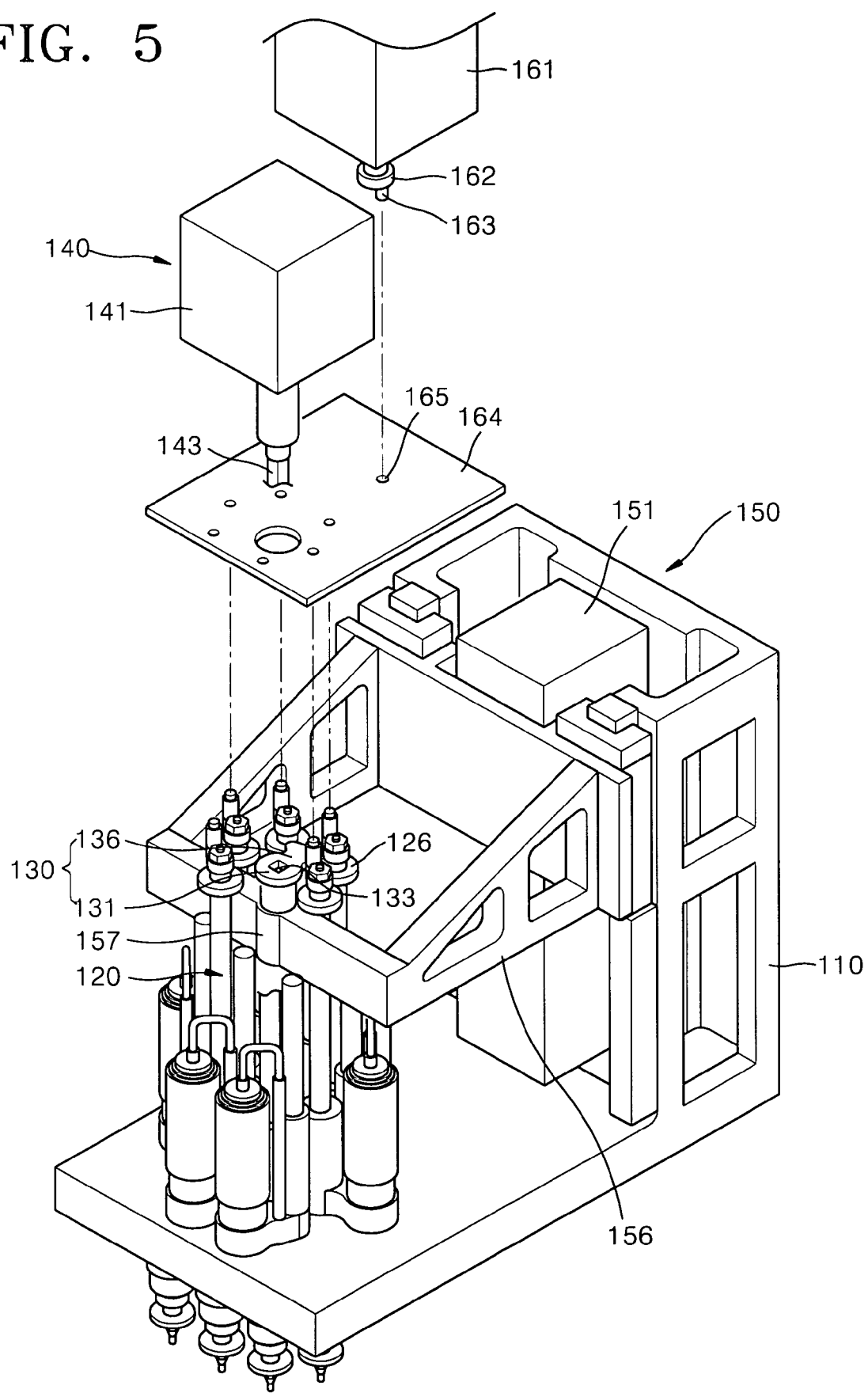
FIG. 5 is a partially exploded perspective view of the head assembly of FIG. 4.

FIG. 4 is a perspective view of a head assembly 100 for a chip mounter according to a first embodiment of the present invention and FIG. 5 illustrates an elevating driver and a horizontal driver shown in FIG. 4. Referring to FIGS. 4 and 5, the head assembly 100 includes a housing 110, a plurality of nozzle spindles 120, a selection member 130, a horizontal driver 140, and an elevating driver 150. The housing 110 has a plurality of spindle receiving holes 112.

Each nozzle spindle 120 of the plurality is fitted with a nozzle 122 configured to pick up and mount electronic components. Each nozzle spindle 120 of the plurality is movably and rotatably inserted into a corresponding spindle receiving hole 112. Bearings (not shown) may be interposed between the nozzle spindles 120 and the spindle receiving holes 112 in order to support vertical motion and rotational motion of the nozzle spindles 120.

The selection member 130 is configured to select one or more of the nozzle spindles 120 at a time for vertical movement. The selected nozzle spindle 120 is vertically moved simultaneously with the selection member 130. The horizontal driver 140 horizontally moves (i.e., rotates) the selection member 130 in such a way as to position the selection member 130 proximate the nozzle spindle 120 to be selected. The elevating driver 150 vertically moves the selection member 130 together with the at least one nozzle spindle 120 selected by the selection member 130.

In conventional head assemblies, the quantity of elevating drive motors corresponds to the quantity of nozzle spindles in a 1:1 relationship to independently select at least one of the plurality of nozzle spindles 120 and vertically move the same. For example, when one conventional head assembly includes six nozzle spindles 120, six separate elevating drive motors may be needed. However, the head assembly 100 according to one embodiment of the present invention is provided with only two motors, i.e., a first motor mounted in the elevating driver 150 that vertically moves the selection member 130, and a second motor mounted in the horizontal driver 140 that horizontally moves the selection member 130.

The horizontal driver 140 horizontally moves the selection member 130 by rotating the selection member 130 by a predetermined angle so that the selection member 130 can select at least one nozzle spindle 120 to be moved upward and downward. To achieve this purpose, the plurality of nozzle spindles 120 are arranged along the same circumference about one central axis and the selection member 130 is configured to rotate about the central axis and include a portion that travels about the circumference. The selection member 130 may be configured to select one or more nozzle spindles 120 at a time. That is, to mount an electronic component on a printed circuit board (PCB), one nozzle spindle 120 should be selected and vertically moved onto the PCB. Reducing the overall mounting time can be accomplished by increasing the speed at which a plurality of electronic components is picked up. That is, a plurality of nozzle spindles 120 may be selected for simultaneous vertical movement in order to simultaneously pick up adjacent electronic components. The shape of one example selection member 130 for achieving this purpose will be described in further detail hereafter.

Figure 6A:
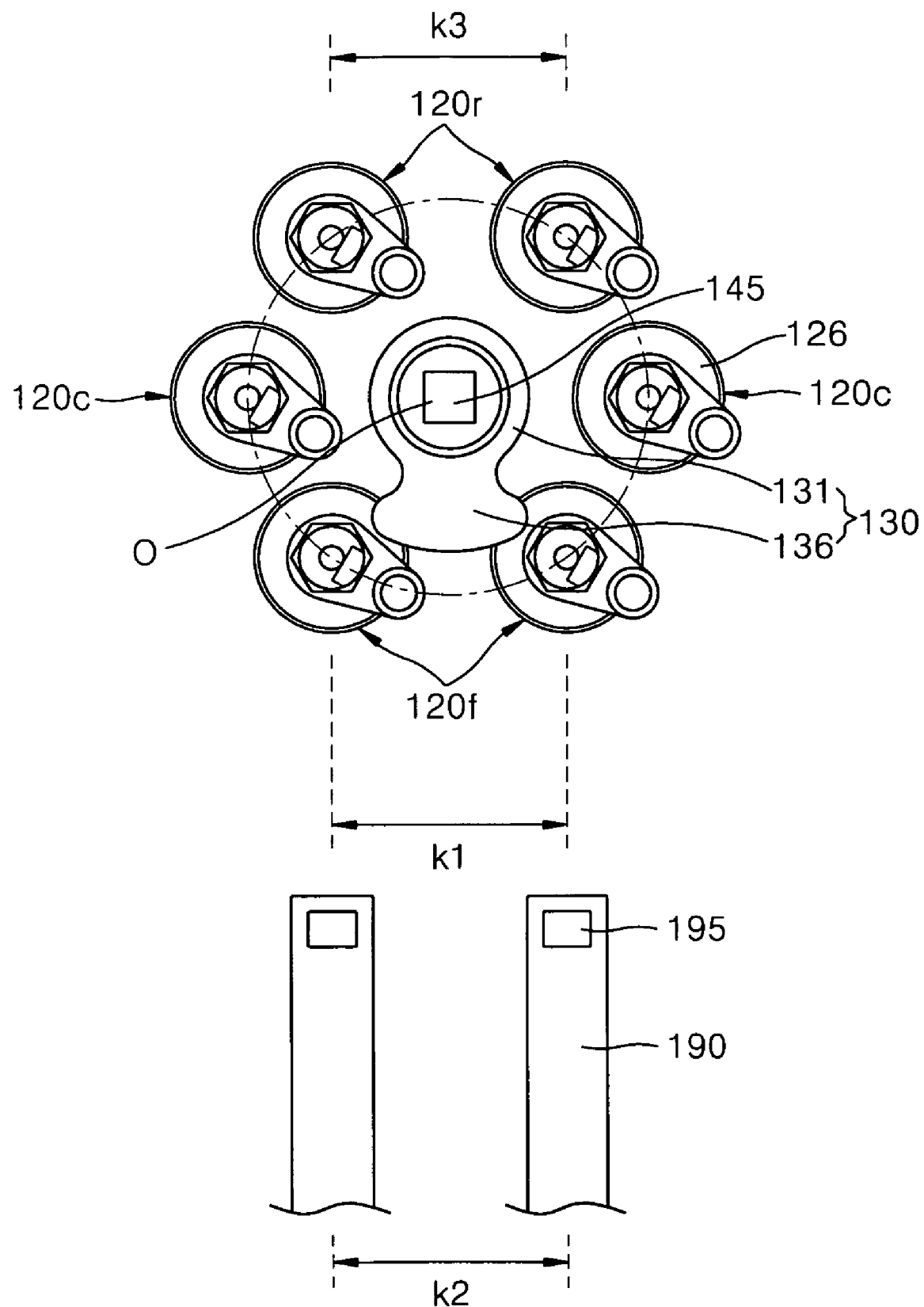
FIG. 6A is a top view illustrating the structural relationship between the nozzle spindles and the selection member shown in FIG. 4.
Figure 6B:
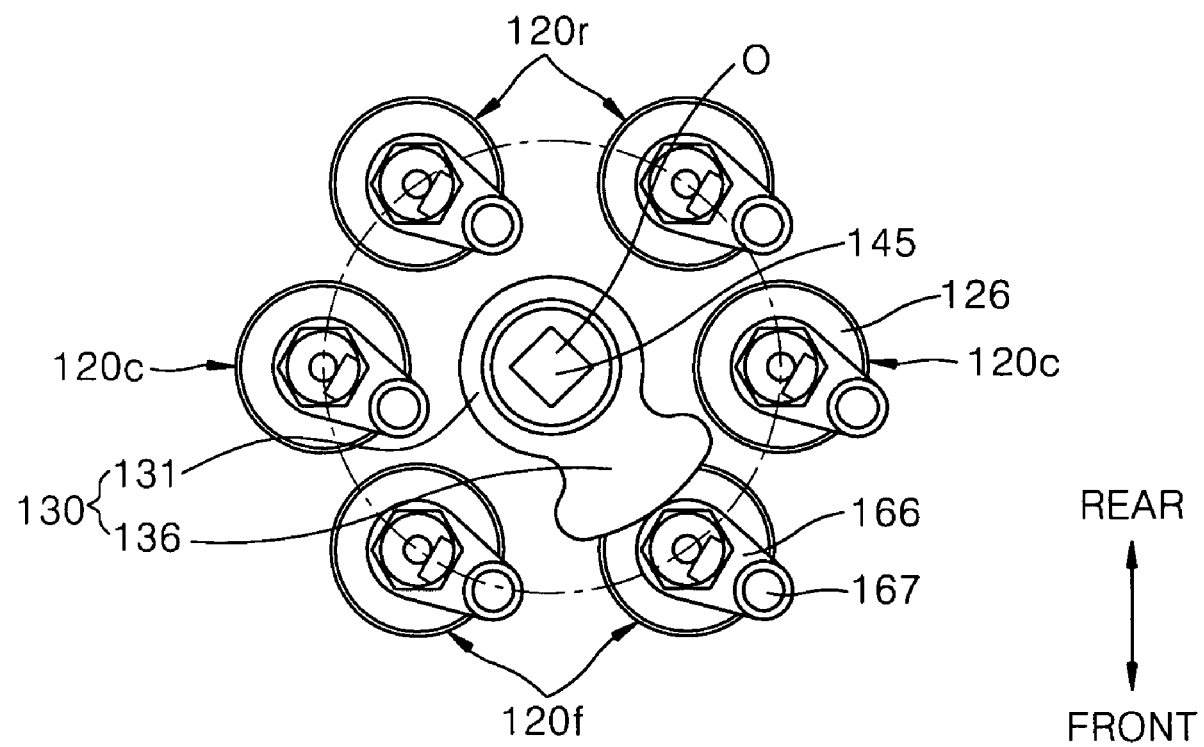
FIG. 6B is a modified example of FIG. 6A.

FIG. 6A is a top view illustrating the structural relationship between the nozzle spindles 120 and the selection member 130 and FIG. 6B is a modified example of FIG. 6A. Referring to FIGS. 6A and 6B, the nozzle spindles 120 may include two front nozzle spindles 120f arranged parallel to each other and two rear nozzle spindles 120r arranged parallel to each other. In this case, the two front nozzle spindles 120f are located parallel to adjacent component feeders 190 supplying components 195 to be picked up. The two rear nozzle spindles 120r are disposed diametrically opposite to and configured similarly to the two front nozzle spindles 120f.

As shown in FIG. 6A, the selection member 130 is oriented over the two front nozzle spindles 120f so that the spindles 120f may be simultaneously vertically moved to pick up an electronic component 195. Similarly, the selection member may be rotated about 180 degrees from the orientation illustrated in FIG. 6A so that the two rear nozzle spindles 120r are simultaneously selected by the horizontally moved selection member 130 to pick up the electronic component. To this end, a distance k1 between the two front nozzle spindles 120f and two rear nozzle spindles 120r may be substantially similar to a distance k2 between the two parallel component feeders 190. Of course, as shown in FIG. 6B, the selection member 130 may be oriented, configured or controlled to select only one nozzle spindle for vertical movement.

In this case, the horizontal driver 140 may rotate the selection member 130 about the center of a polygon formed by virtual lines connecting the spindle receiving holes 112. For example, when the nozzle spindles 120 are arranged along a circumference about a central axis O, a rotary axis of the selection member 130 may be the same as the central axis O as described above. This is because the selection member 130 having a predetermined length in contact with one nozzle spindle 120 can come in contact with another nozzle spindle 120 while rotating.

Referring to FIGS. 5-6B, the horizontal driver 140 horizontally moves the selection member 130 such that the selection member 130 can select the nozzle spindle 120 to be moved downward. The elevating driver 150 vertically moves the selection member 130 such that the selection member 130 can vertically move the nozzle spindle 120. Thus, the present invention is provided with two drive motors —a first motor to select one or more nozzle spindles 120, and a second motor to vertically move the one or more selected nozzle spindles 120 in the head assembly 100.

Figure 7:
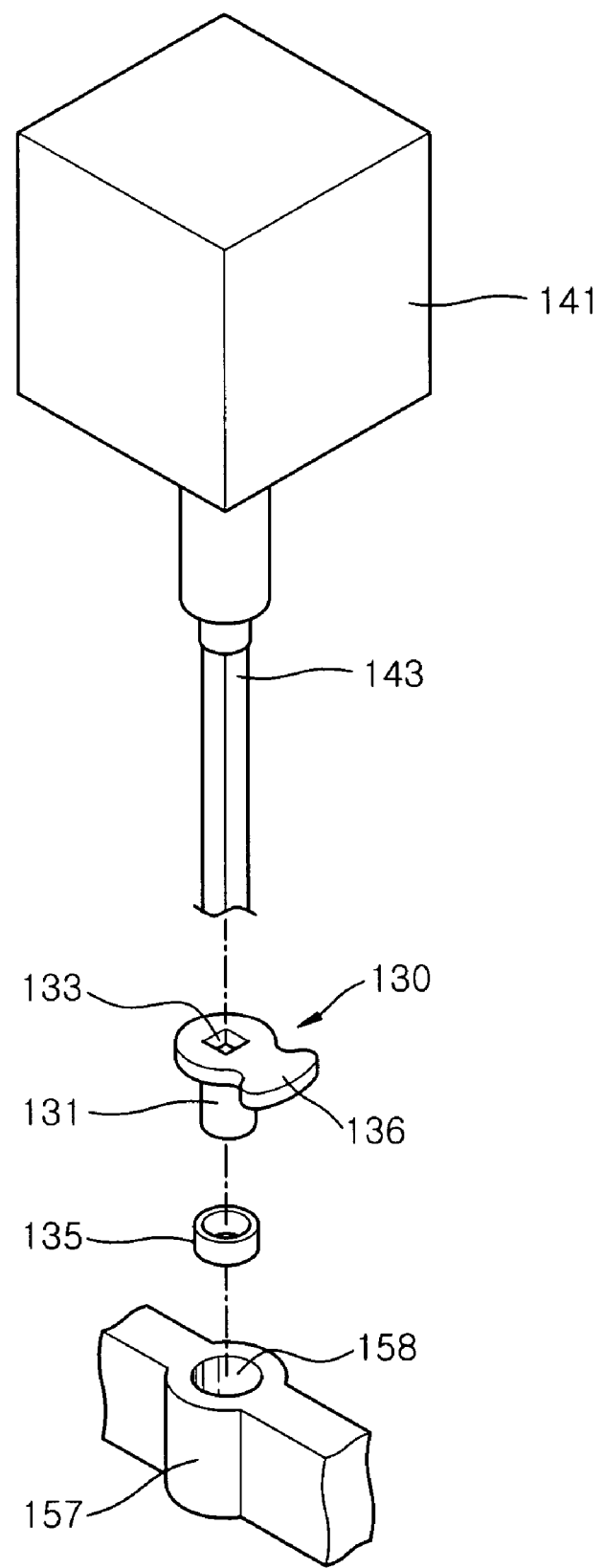
FIG. 7 is an exploded perspective view of the horizontal driver shown in FIG. 4.

The selection member 130 includes a combining portion 131 and a spindle contacting portion 136. The combining portion 131 is movably coupled with the horizontal drive motor 141 for horizontal (i.e., rotational) movement and is also configured for vertical movement in response to the elevating driver 150. That is, as best illustrated in FIG. 7, the combining portion 131 is configured to move vertically along the connecting axis 143 when the elevating driver 150 is actuated to lower one or more nozzle spindles 120. Thus, the selection member 130 may be substantially simultaneously or independently moved horizontally by the horizontal drive 140 and vertically by the elevating driver 150.

The spindle contacting portion 136 projects out from the combining portion 131 in order to contact at least one nozzle spindle 120. The spindle contacting portion 136 is configured to have a length between both distal ends that allows adjacent nozzle spindles 120 to be contacted simultaneously as shown in FIG. 6A. Furthermore, when one nozzle spindle 120 is contacted by a middle part of the spindle contacting portion 136, an adjacent nozzle spindle 120 may not be contacted by the spindle contacting portion 136 so that only one nozzle spindle 120 is raised or lowered.

One or more of the plurality of nozzle spindles 120 has a selection member contacting portion 126 (FIG. 5) projecting from the side thereof so as to contact the selection member 130. The spindle contacting portion 136 of the selection member 130 can be configured to contact the selection member contacting portion 126. Thus, the spindle contacting portion 136 can press down on the selection member contacting portion 126 to move downward at least one selected nozzle spindle 120.

In an embodiment, the nozzle spindle 120 has an elastic member that provides an upward bias for the nozzle spindle 120 to maintain a predetermined distance between the nozzles 122 and a surface (e.g., a conveyor 190). When a force pressing downward on the selection member 130 is released, the nozzle spindle 120 can be returned to its original predetermined height. The present invention is not limited to the configuration described above. For example, a descent stopper may be disposed on a bottom of the head assembly 100 in order to prevent the nozzle spindle 120 from descending greater than a predetermined interval or distance. The descent stopper provides upward resistance that is greater than the load of the nozzle spindle 120. That is, the nozzle spindle 120 is moved downward to a position where the nozzle spindle 120 is in contact with the descent stopper during pickup and then moved upward by the descent stopper when the force pressing downward on the selection member 130 is released.

The structures of the selection member 130, the elevating driver 150, and the horizontal driver 140 will now be described in more detail.

Referring to FIG. 5, the elevating driver 150 includes an elevating drive motor 151 and an elevating member 156 on which the selection member 130 is rotatably mounted and which is driven by the elevating drive motor 151 to vertically move upward or downward. As shown in FIG. 5, the elevating drive motor 151 is mounted on the housing 110 and configured to vertically move the elevating member 156. As the elevating member 156 moves vertically up and down, the selection member 130 simultaneously moves up and down, being rotatably coupled in a selection member fixing portion 157 of the elevating member 156. The elevating drive motor 151 may be, for example, a voice coil motor. The high-output, lightweight voice coil motor can reduce the overall size of the head assembly 100. Alternatively, the elevating drive motor 151 may be an LM guide, a ball screw, or other linear motor or actuator known in the art. As shown, the elevating member 156 has one side combined with the elevating drive motor 151, and a second side including the selection member fixing portion 157 into which the selection member 130 is rotatably fitted.

An example of the structure of the selection member 130 combined into the selection member fixing portion 157 will now be described with reference to FIG. 7.

Referring to FIG. 7, the selection member fixing portion 157 has an insert hole 158 into which the combining portion 131 is fitted so that the selection member 130 can rotate. To achieve this purpose, a bearing 135 may be disposed between the insert hole 158 and the combining portion 131. This structure allows the horizontal driver 140 to rotate the selection member 130.

Referring to FIG. 5, the horizontal driver 140 includes a horizontal drive motor 141 and a shaft or connecting axis 143 connected to an axis of the horizontal drive motor 141. The selection member 130 is vertically movably fitted to the connecting axis 143. The combining portion 131 of the selection member 130 has a through hole 133 (FIG. 7) into which the connecting axis 143 is inserted. In this case, the connecting axis 143 is elongated to generally correspond with a range of vertical movement for the nozzle spindles 120 so that the selection member 130 moves upward or downward along the vertical range and serves as a guide as well.

In this case, the connecting axis 143 is inserted into the selection member 130 so that the combining portion 131 of the selection member 130 can be driven by the horizontal drive motor 141 to horizontally move and, in particular, rotate and can move vertically regardless of the rotation of the horizontal drive motor 141. To this end, the connecting axis 143 may be slidably coupled with the through hole 133 of the selection member 130 (i.e., the selection member 130 may freely move along the length of connecting axis 143). Alternatively, as shown in FIG. 7, because the through hole 133 and the connecting axis 143 have the same polygonal shape, the combining portion 131 can rotate at the same rate as the connecting axis 143 while the selection member 130 moves upward or downward along the connecting axis 143. In this case, the combining portion 131 of the selection member 130 is fitted into the vertically penetrated insert hole 158 and the connecting axis 143 is inserted into the through hole 133 of the combining portion 131, thereby allowing the connecting axis 143 to penetrate through the through hole 133 of the selection member 130 and the insert hole 158 of the elevating member 156.

Figure 8:
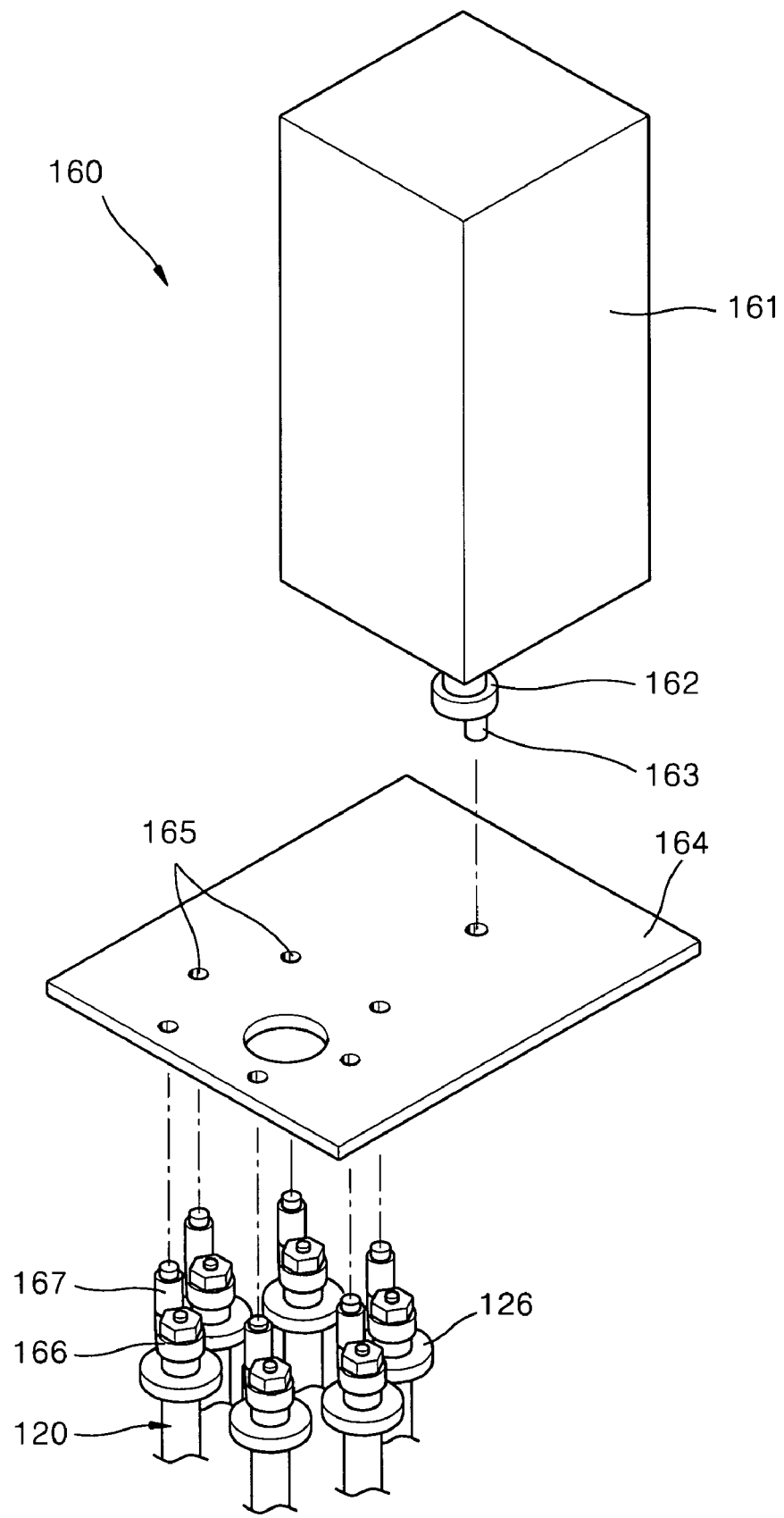
FIG. 8 is an exploded perspective view of the spindle rotator shown in FIG. 4.

Referring to FIG. 8, the head assembly 100 may further include a spindle rotator 160. Each vertical nozzle spindle 120 has a substantially vertical axis extending therethrough and the spindle rotator 160 is configured to rotate the nozzle spindles 120 about the substantially vertical axes through a predetermined angle. The spindle rotator 160 may use one spindle rotating motor 161 to rotate all of the nozzle spindles 120. Unlike conventional head assemblies, the nozzle spindles 120 of the present invention are not connected to the spindle rotating motor 161 with a belt or gear for rotation.

The spindle rotator 160 as shown in FIG. 8 includes the spindle rotating motor 161, a motor crank arm 162, a connecting support plate 164 and a plurality of spindle crank arms 166 that cooperate to rotate the plurality of nozzle spindles 120. The motor crank arm 162 is fitted to the spindle rotating motor 161 and has a first eccentric axis 163 deviating from the rotary axis of the spindle rotating motor 161. The connecting support plate 164 includes a hole or aperture that is configured to receive the first eccentric axis 163. As the spindle rotating motor 161 rotates, the connecting support plate 164 rotates with predetermined eccentricity. Each of the plurality of spindle crank arms 166 is connected to a corresponding one of the nozzle spindles 120 and has a second eccentric axis 167 that deviates from the central axis of the nozzle spindle 120 by the same distance as for the first eccentric axis 163. Each of the second eccentric axes 167 is received in a hole or aperture 165 in the connecting support plate 164. Thus, the second eccentric axes 167 rotate with a predetermined eccentricity with respect to the nozzle spindle 120 as the connecting support plate 164 rotates relative to the rotation of the spindle rotating motor 161, thereby allowing the nozzle spindle 120 to rotate.

Thus, one motor can be used to rotate all the nozzle spindles 120 and no backlash occurs because a substantially rigid body is used to mechanically couple the spindles 120 with the motor.

The operation of the head assembly 100 having the above-mentioned construction will now be described with reference to FIGS. 4-8. First, when an electronic component 195 is located at a pick up position of the component feeder 190, the horizontal driver 140 moves to select the nozzle spindle 120 that is desired for picking up the electronic component 195. In this case, the horizontal driver 140 may select one or more of a plurality of nozzle spindles 120 at a time. To this end, the horizontal driver 140 rotates the selection member 130 so that the spindle contacting portion 136 of the selection member 130 is located above a portion of the spindle nozzle 120.

When the head assembly 100 is positioned above the component feeder 190, the elevating driver 150 moves downward to also move downward the selection member 130, which is coupled with the selection member fixing portion 157 of the elevating member 156. The selection member 130 then presses down on at least one nozzle spindle 120 located below the selection member 130, causing the spindle 120 to move downward. Then at least one nozzle spindle 120 picks up the electronic component 195. To configure the head assembly 100 for use with two parallel component feeders 190, the two front nozzle spindles 120$f$ (and two rear nozzle spindles 120$r$) may be configured with a distance k1 between them that may be substantially similar to a distance k2 between the two parallel component feeders 190. The plurality of nozzle spindles 120 can simultaneously pick up a plurality of electronic components. The one or more nozzle spindles 120 that have picked up the electronic component may be moved upward by, for example, the elevating driver 150 or elastic biasing member. The above steps are repeated for the other nozzle spindles 120 to picked up other components.

Subsequently, the head assembly 100 is moved to a mounting position on a PCB. A process of moving the head assembly 100 to the mounting position includes sensing the position and status of an electronic component that has been picked up by the nozzle spindle 120 using, for example, a photographing device in the head assembly 100 or chip mounter, checking a variation between the position of the electronic component and a reference position on the PCB, and driving the spindle rotating motor 161 in order to rotate the nozzle spindle 120.

Subsequently, the horizontal driver 140 drives the selection member 130 to select the nozzle spindle 120 having the electronic component to be mounted and the elevating driver 150 moves downward the selection member 130 and selected nozzle spindle 120 in order to mount an electronic component on the PCB.

As can be appreciated, the above construction of a head assembly 100 can be configured or adapted to increase the number of nozzle spindles 120. For example, a head assembly according to the foregoing embodiment may simply include additional selection members 130 and additional horizontal drivers 140 to accommodate additional nozzle spindles 120. A head assembly for a chip mounter according to another embodiment of the present invention is now described.

Figure 9:
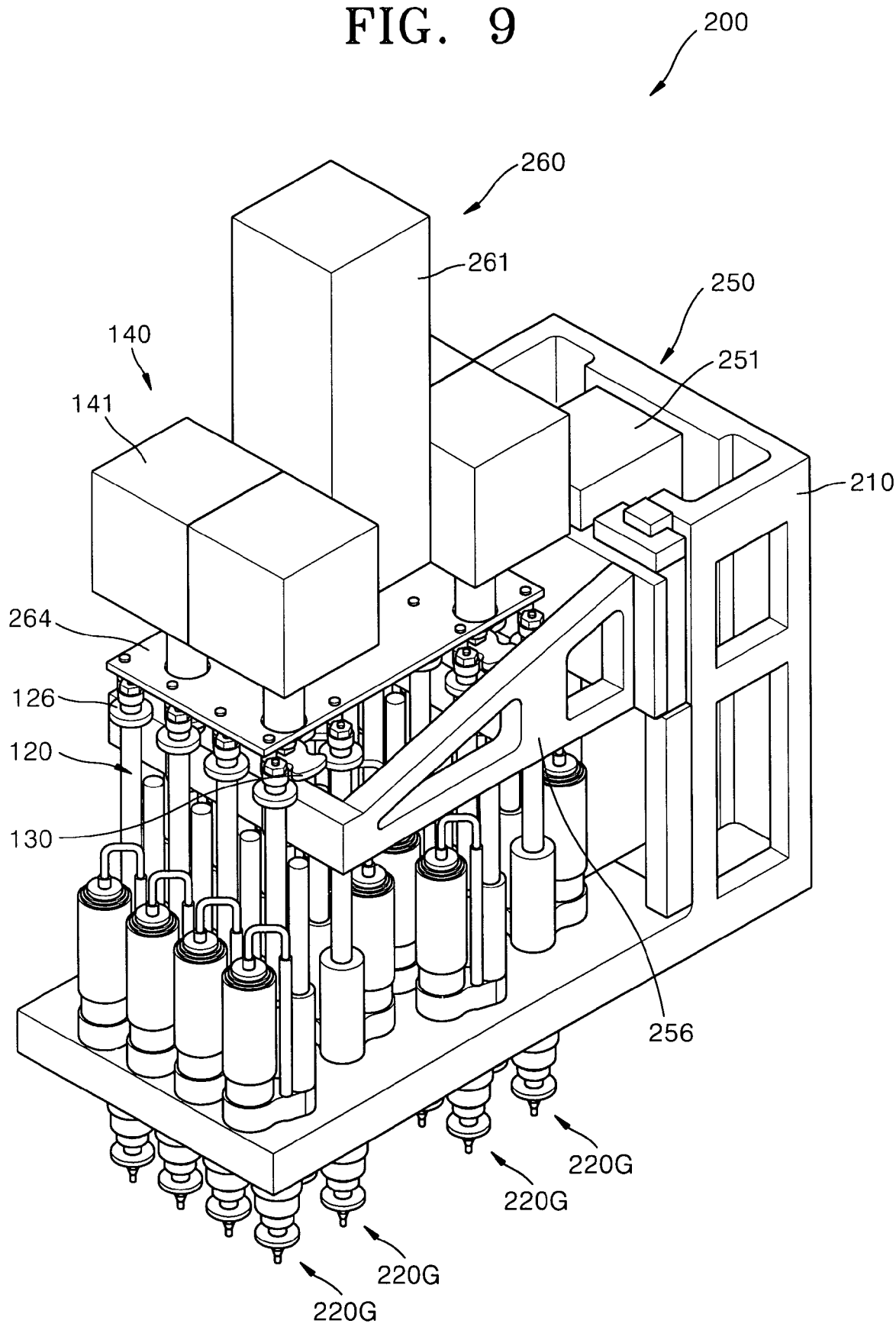
FIG. 9 is a perspective view of a head assembly for a chip mounter according to another embodiment of the present invention.
Figure 10:
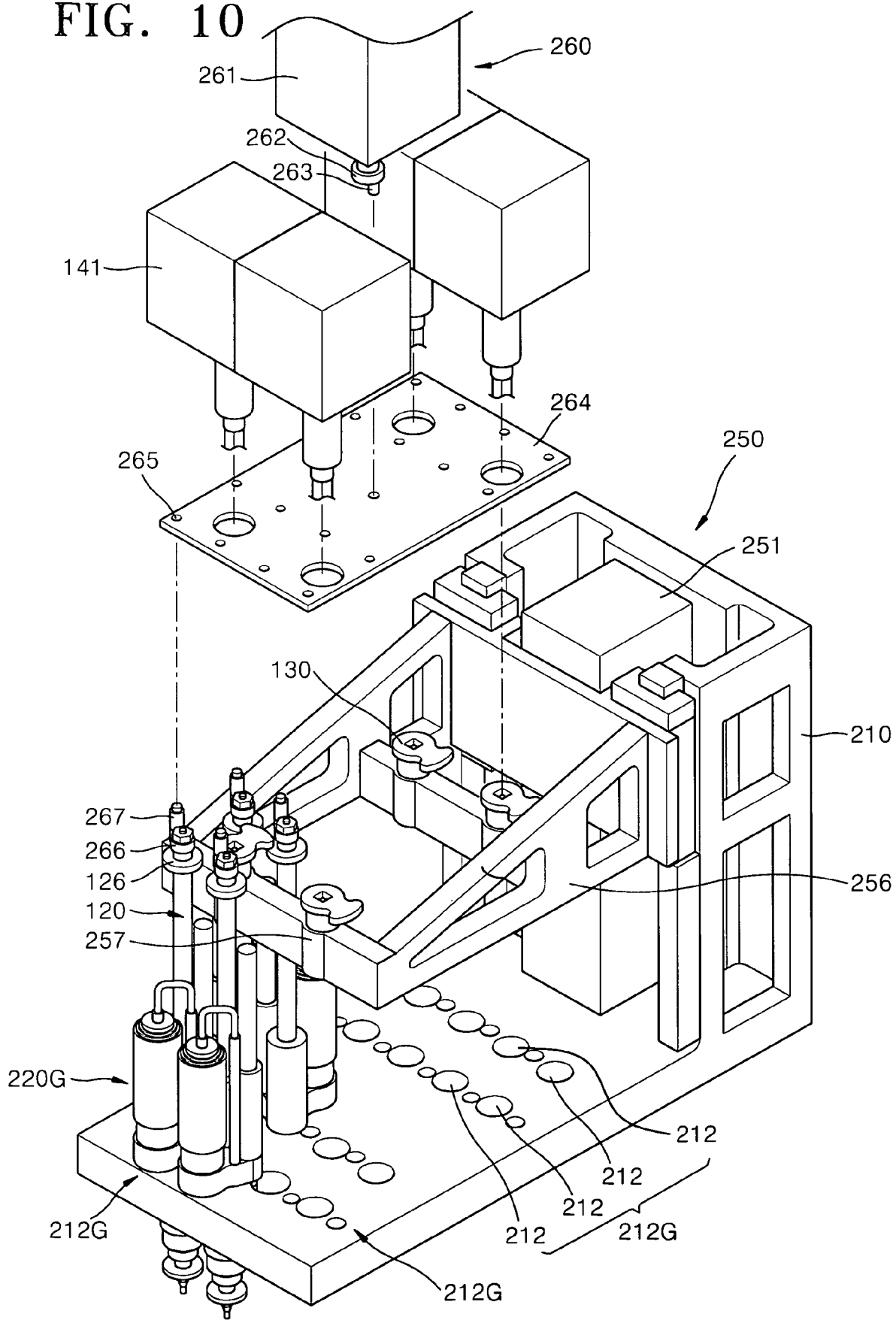
FIG. 10 is a partially exploded perspective view of the head assembly of FIG. 9.

FIG. 9 is a perspective view of a head assembly 200 for a chip mounter according to another embodiment of the present invention and FIG. 10 is an exploded perspective view of FIG. 9. Referring to FIGS. 9 and 10, the head assembly 200 includes a housing 210, a plurality of nozzle spindle groups 220G, a plurality of selection members 130, a plurality of horizontal drivers 140, and an elevating driver 250. The housing 210 has a plurality of spindle receiving hole groups 212G (FIG. 10) wherein each group 212G has a plurality of spindle receiving holes 212.

The plurality of nozzle spindle groups 220G are provided corresponding to the plurality of spindle receiving hole groups 212G. A quantity of selection members 130 is provided to correspond with a quantity of groups in the plurality of nozzle spindle groups 220G, each selection member 130 selecting at least one spindle nozzle 120 within a corresponding nozzle spindle group 220G. Each of the plurality of horizontal drivers 140 horizontally moves the corresponding selection member 130 in such a way as to change the nozzle spindle 120 being selected within its corresponding nozzle spindle group 220G. In this case, one horizontal driver 140 is provided for each nozzle spindle group 220G. The elevating driver 250 uses one motor to simultaneously move upward or downward the selection members 130.

For example, assuming that a conventional head assembly includes four nozzle spindle groups 220G with each nozzle spindle group 220G containing four nozzle spindles 120, the conventional head assembly requires 16 elevating motors corresponding to the 16 nozzle spindles 120 to independently move the spindles 120 vertically. However, the head assembly 200 according to the present embodiment of the invention needs a total of five motors including: four motors for the four horizontal drivers 140, each horizontally moving (i.e., rotating) one selection member 130 for each nozzle spindle group 220G; and one motor for the elevating driver 250. Thus, the present invention can provide a lightweight, high-speed, high-precision, compact head assembly with low manufacturing costs. In particular, the effect of the present invention increases as the number of the nozzle spindles 120 increases.

Because the selection member 130 corresponding to each nozzle spindle group 220G and the horizontal driver 140 horizontally moving the selection member 130 have the same constructions as their counterparts in the head assembly 100 according to the embodiment illustrated in FIG. 4, detailed explanation thereof will not be given.

The elevating driver 250 includes an elevating drive motor 251 and an elevating member 256 on which the selection member 130 is rotatably mounted and which is driven by the elevating drive motor 251 to move upward or downward. The elevating drive motor 251 may be, for example, a voice coil motor vertically mounted on a position on the housing 210, for example, where the plurality of spindle receiving hole groups 212G are not formed. The high-output, lightweight voice coil motor can reduce the overall size of the head assembly 200. Alternatively, the elevating drive motor 251 may be an LM guide, a ball screw, or other linear motor or actuator known in the art.

The elevating member 256 has one side combined with the elevating drive motor 251 and a plurality of selection member fixing portions 257 into which the plurality of selection members 130 corresponding to the plurality of nozzle spindle groups 220G are rotatably fitted.

Thus, one horizontal driver 140 is disposed corresponding to each of the plurality of nozzle spindle groups 220G and moves the selection member 130 to select the nozzle spindle 120 to be moved vertically. After the selection member 130 is oriented as desired, then the elevating driver 250 is actuated to move downward or upward the selected nozzle spindle 120.

Figure 11:
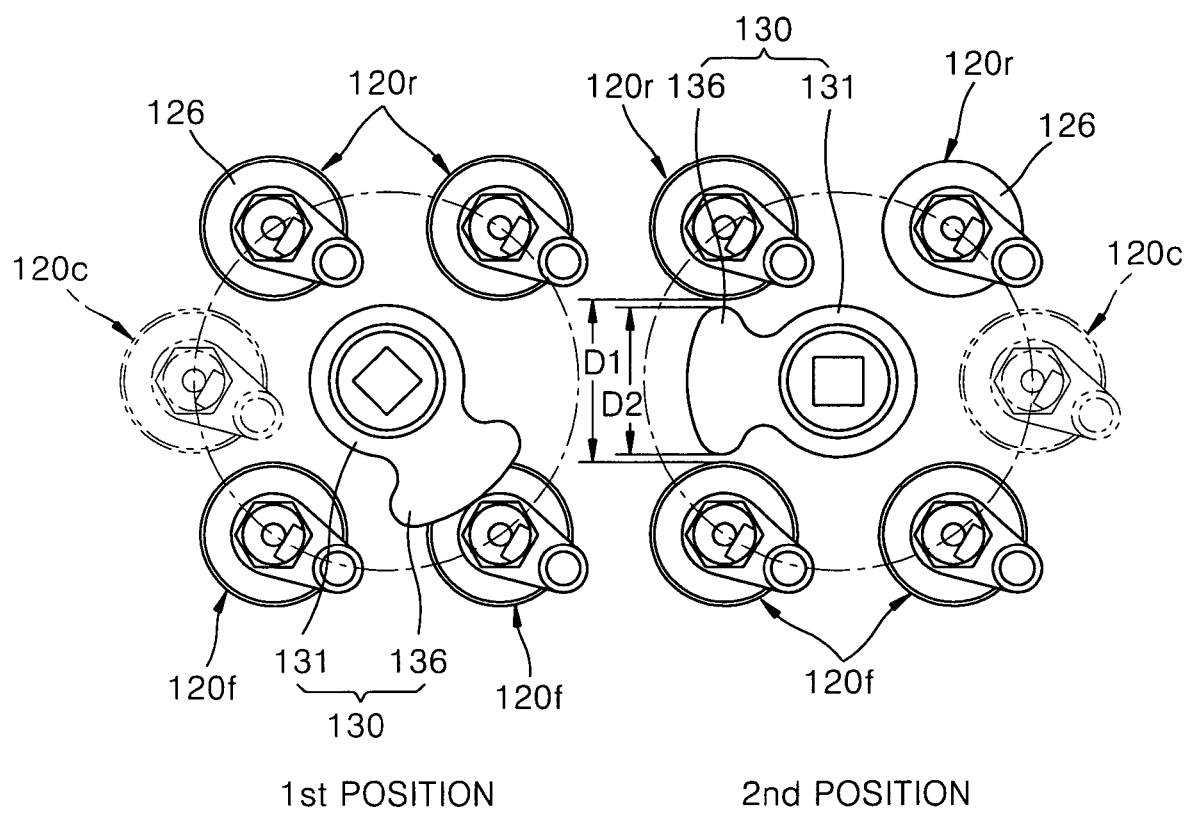
FIG. 11 is a top view illustrating the structural relationship between the plurality of nozzle spindle groups and selection member shown in FIG. 9.

In a case shown in FIG. 11 (right-hand side), the horizontal driver 140 may move one or more selection members 130 of the plurality of selection members 130 to a position where only one nozzle spindle 120 is selected by the plurality of selection members 130. Since the elevating driver 250 moves the plurality of selection members 130 simultaneously, the illustrated configuration of the spindles 120 and selection members 130 helps to move downward only a desired number of nozzle spindles 120 for pick up or mounting.

To this end, as shown in FIG. 11, at least one of distances between adjacent nozzle spindles 120 (distance D1 between the two front and two rear spindles 120*f*, 120*r*) within one nozzle spindle group 220G may be greater than a length between two distal ends of the spindle contacting portion 136 (distance D2) of the selection member 130. With the nozzle spindles 120 configured as shown, the selection member 130 may be located at: a first position (illustrated, for example, in FIG. 11, left-hand side) where one or more of the nozzle spindles 120 may be raised and lowered by the elevating driver 250; and a second position (illustrated in FIG. 11, right-hand side) where the distance between adjacent nozzle spindles 120 is greater than the length of the spindle contacting portion 136 such that no nozzle spindle is lowered or raised by the elevating driver 250. In this way, the horizontal driver 140 horizontally moves the selection member 130 to one of the first and second positions relative to the quantity and configuration of electronic components to be picked up and/or mounted.

Figure 12:
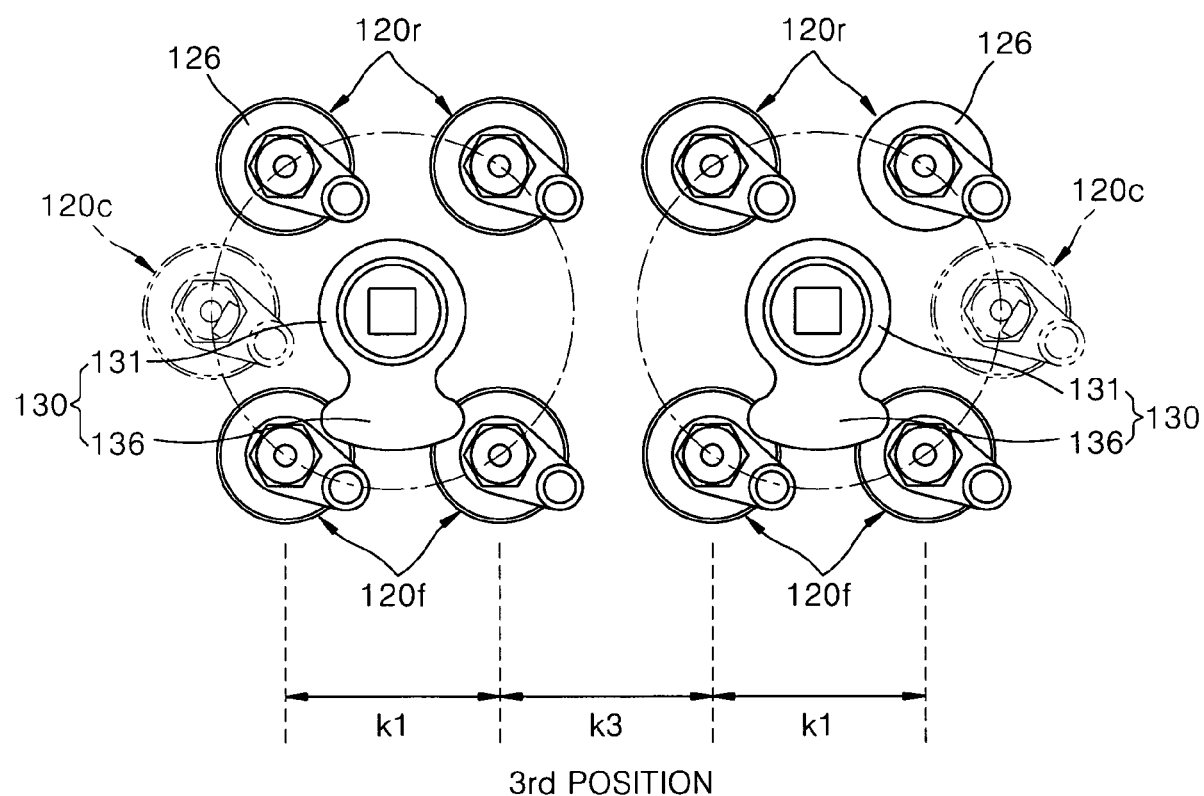
FIG. 12 is a top view illustrating another example of FIG. 11.
Figure 12:
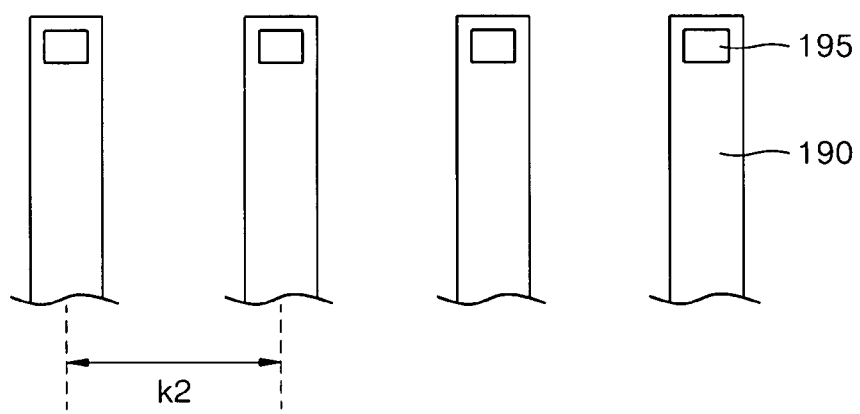
Figure 13:
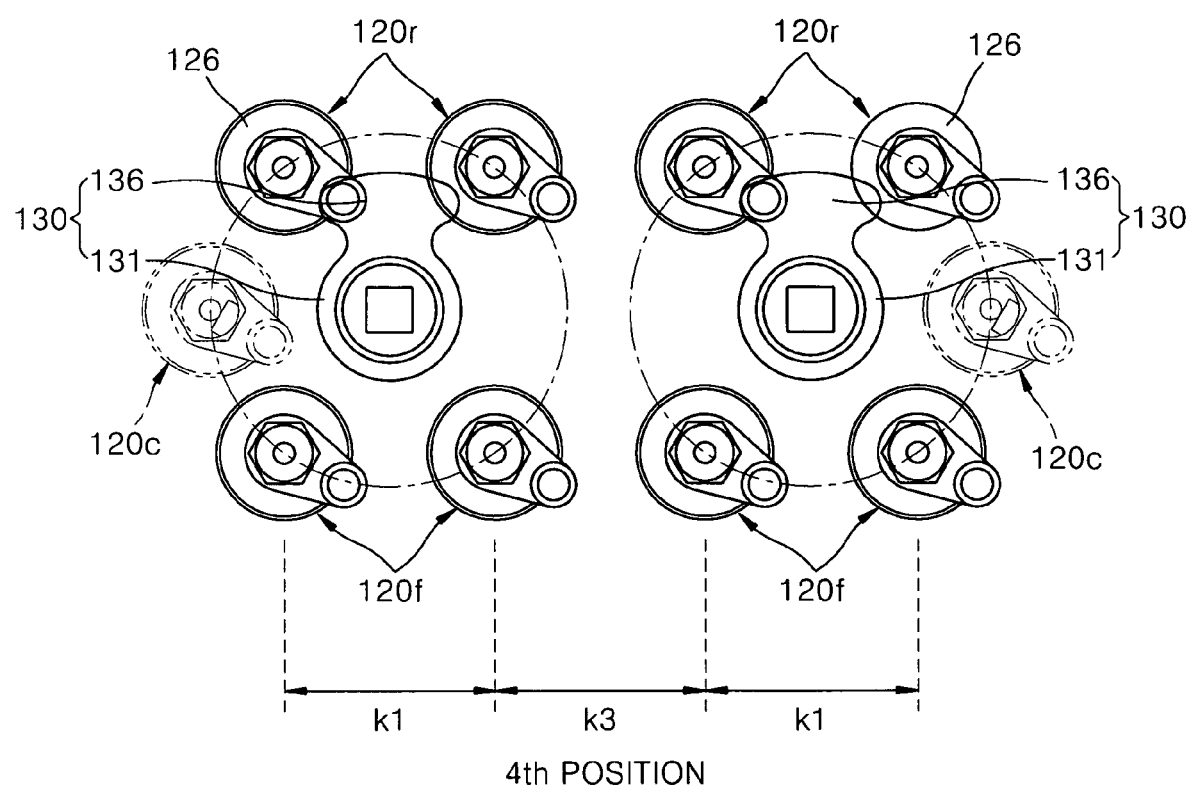
FIG. 13 is a top view illustrating yet another example of FIG. 11.
Figure 14:
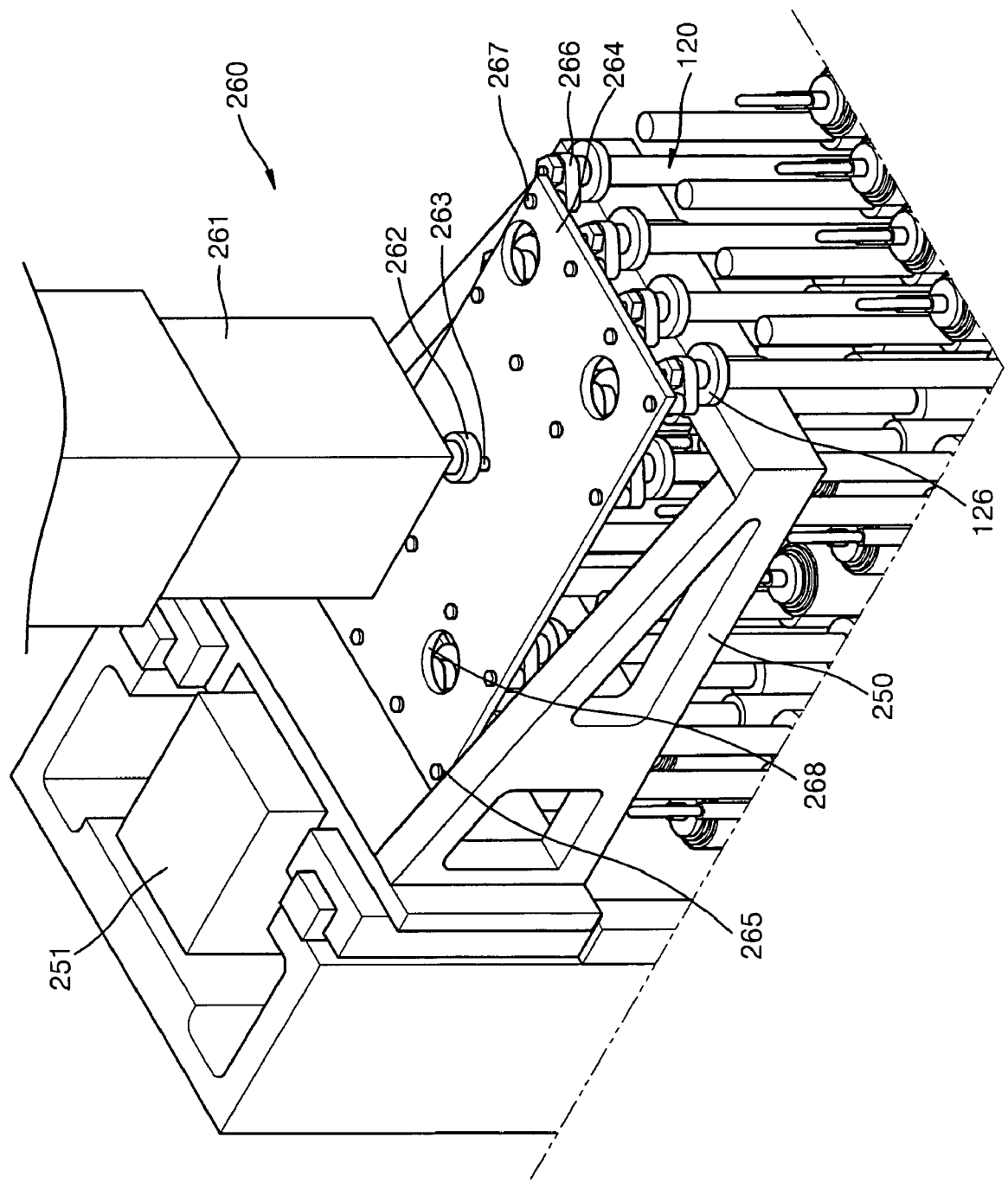
FIG. 14 is an enlarged perspective view of the spindle rotator shown in FIG. 9.

At least one of distances between front nozzle spindles 120*f* and rear nozzle spindles 120*r* may be separated so as not to select any one or more of the two front and two rear nozzle spindles 120*f*, 120*r*. As shown in FIGS. 11-13 one nozzle spindle group 220G may include at least one second position. As illustrated, the group 220G is configured with two adjacent second positions, one second position corresponding to a first selection member 130 and another second position corresponding to a second selection member 130. In this way, as can be appreciated, the two selection members 130 may together select no spindles (e.g., when both selection members 130 are located at the second positions between the front nozzle spindles 120*f* and the rear nozzle spindles 120*r*), one spindle, two spindles, three spindles or four spindles. As shown, one or more intermediate nozzle spindles 120*c* may optionally be located at a position between the front and rear nozzle spindles 120*f* and 120*r* and, for example, as shown in FIG. 11 disposed leftward or rightward of the second position.

Moreover, as shown in FIGS. 12 and 13, a distance k3 between the nozzle spindles 120 within adjacent nozzle spindle groups 220G, which are separated parallel to component feeders 190 supplying electronic components to be picked up, may be substantially similar to a distance k2 between the two component feeders 190.

That is, assuming that the two front and two rear nozzle spindles 120*f* and 120*r* are disposed parallel to the component feeders 190, as shown in FIG. 12, the distance k3 between front nozzle spindles 120 within the adjacent nozzle spindle groups 220G may be substantially similar to the distance k2 between the adjacent parallel component feeders 190. Furthermore, as shown in FIG. 13, the distance k3 between rear nozzle spindles 120 within adjacent nozzle spindle groups 220G may be substantially similar to a distance between the adjacent parallel component feeders 190.

A distance k1 between adjacent nozzle spindles 120 within one nozzle spindle group 220G may also be substantially similar to the distance k2 between the adjacent parallel component feeders 190. Thus, when the two nozzle spindle groups 220G are disposed parallel to each other and each nozzle spindle group 220G contains two front and two rear parallel nozzle spindles 120f, 120r as shown in FIGS. 12 and 13, it is possible to simultaneously pick up four electronic components 195 with the two nozzle spindle groups 220G.

Thus, as shown in FIGS. 11-13, each nozzle spindle group 220G includes at least two front and two rear nozzle spindles 120f, 120r. In this case, the horizontal driver 140 can drive the selection member 130 so that the selection member 130 can be located at a first position where each nozzle spindle 120 can be individually selected (FIG. 11, left-hand side), a second position where no nozzle spindle 120 can be selected (FIG. 11, right-hand side), a third position where at least two front nozzle spindles 120 can be simultaneously selected (FIG. 12), or a fourth position where at least two rear nozzle spindles 120 can be simultaneously selected (FIG. 13). Each nozzle spindle 120 of each nozzle spindle group 220G can be individually selected. Additionally, no nozzle spindles 120 can be deliberately selected.

Meanwhile, the nozzle spindles 120 having the above-mentioned construction can separately rotate, or a spindle rotator including one drive motor is used to rotate all of the nozzle spindles 120 together. To achieve this purpose, the nozzle spindles 120 can be connected to the drive motor with a belt or gear. However, precision may be degraded after long time use of a connector such as a belt or gear.

Thus, referring to FIGS. 10-14, a spindle rotator 260 includes a spindle rotating motor 261, a motor crank arm 262, a connecting support plate 264, and a plurality of spindle crank arms 266 that cooperate to simultaneously rotate all of the nozzle spindles 120.

The motor crank arm 262 is fitted to the spindle rotating motor 261 and has a first eccentric axis 263 deviating from the rotary axis of the spindle rotating motor 261. As shown in FIG. 10, the connecting support plate 264 includes a hole or aperture that receives the first eccentric axis 263 for simultaneously rotating all of the nozzle spindles 120. Each of the plurality of spindle crank arms 266 is connected to a corresponding one of the nozzle spindles 120 and has a second eccentric axis 267 that deviates from the central axis of the nozzle spindle 120 by the same distance as for the first eccentric axis 263. Because the second eccentric axes 267 are received within holes or apertures 265 of the connecting support plate 264, when the connecting support plate 264 rotates in response to actuation of the spindle rotating motor 261 and first eccentric axis 263, the second eccentric axes 267 rotate in the same manner as the connecting support plate 264. Then, the plurality of spindle crank arms 266 having a predetermined amount of eccentricity with respect to the second eccentric axes 267 rotate, thus allowing the nozzle spindle 120 connected to each of the plurality of spindle crank arms 266 to rotate.

That is, the present invention uses one spindle rotating motor 261 to simultaneously rotate, thereby providing a compact, lightweight head assembly 200 with low manufacturing costs. The present invention also allows the spindle rotator 261 to be directly and rigidly coupled with the nozzle spindles 120, thus achieving high-precision mounting without backlash. The advantages increase as the number of nozzle spindles 120 increases as in the head assembly 200 including the plurality of nozzle spindle groups 220G.

Meanwhile, the spindle crank arm 266 is fitted into a top end of the nozzle spindle 120 and the connecting support plate 264 is disposed on the nozzle spindles 120. The spindle rotating motor 261 is disposed on the connecting support plate 264. In this case, the nozzle spindle 120 has a selection member contacting portion 126 (FIG. 10) projecting from the side thereof so as to contact with the selection member 130.

A head assembly having the above-mentioned construction uses an elevating drive motor, a horizontal drive motor, and a selection member to select at least one of nozzle spindles within a nozzle spindle group for vertical movement, thus simplifying the structure of an elevating driver vertically moving the nozzle spindles while reducing the number of components. Thus, the present invention provides a lightweight, compact, backlash-free, inexpensive head assembly achieving high-speed movement.

The head assembly of the present invention also has an increased number of nozzle spindles because its overall weight and size can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A head assembly for a chip mounter comprising:
a housing having a plurality of spindle receiving holes;
a plurality of nozzle spindles configured in the plurality of spindle receiving holes for vertical and rotational movement, each nozzle spindle of the plurality including a nozzle for picking up and mounting electronic components;
a selection member configured to select at least one nozzle spindle of the plurality of nozzle spindles;
a horizontal driver configured to horizontally move the selection member above the plurality of nozzle spindles; and
an elevating driver configured to vertically move the selection member for raising and lowering the at least one nozzle spindle,
wherein the selection member comprises:
a combining portion that is rotatably coupled with the horizontal driver and vertically movable relative to operation of the elevating driver; and
a spindle contacting portion projecting from the combining portion, the spindle contacting portion configured to select one or more of the plurality of nozzle spindles.

2. The head assembly of claim 1, wherein the horizontal driver is connected with the combining portion of the selection member to rotate the spindle contacting portion of the selection member by a predetermined angle in a plane above the plurality of nozzle spindles.

3. The head assembly of claim 2, wherein the nozzle spindles are arranged along a common circumference having a central axis, and
wherein the spindle contacting portion of the selection member rotates about the central axis along the common circumference.

4. The head assembly of claim 1, wherein the plurality of nozzle spindles comprises:
two front nozzle spindles;
two rear nozzle spindles, and
wherein the horizontal driver is operative to move the selection member such that the selection member is oriented to select one or both of the two front nozzle spindles or one or both of the two rear nozzle spindles.

5. The head assembly of claim 4, wherein the horizontal driver rotates the selection member about the center of a polygon formed by virtual lines connecting the spindle receiving holes.

6. The head assembly of claim 4, wherein the two front nozzle spindles and two rear nozzle spindles are separated by a distance substantially similar to a distance between adjacent parallel component feeders that supply electronic components to be picked up.

7. The head assembly of claim 1, wherein the
spindle contacting portion is unitary with the combining portion.

8. The head assembly of claim 1, wherein the elevating driver comprises:
an elevating drive motor; and
an elevating member coupled with the elevating drive motor and vertically movable on the housing, the elevating member including a selection member fixing portion configured to receive the combining portion of the selection member;
wherein the horizontal driver comprises a horizontal drive motor and a connecting axis that is connected to an axis of the horizontal drive motor, the connecting axis being fitted with the combining portion and extending through the selection member fixing portion so that the selection member is moveable upward and downward relative to operation of the elevation drive motor.

9. The head assembly of claim 8, wherein the selection member fixing portion includes an insert hole into which the combining portion of the selection member is fitted, and
wherein the combining portion of the selection member includes a through hole, the through hole and the inset hole being configured generally coaxially to receive the connecting axis therethrough.

10. The head assembly of claim 1, wherein the horizontal driver comprises a horizontal drive motor and a connecting axis, the connecting axis being coupled with the selection member, and
wherein the elevating driver comprises an elevating drive motor and an elevating member movable relative to the housing, the elevating member including a selection member fixing portion into which the selection member is rotatably fitted.

11. The head assembly of claim 1, further comprising a spindle rotator configured to rotate each nozzle spindle of the plurality of nozzle spindles simultaneously.

12. The head assembly of claim 11, wherein the spindle rotator comprises:
a spindle rotating motor;
a motor crank arm that is connected to the spindle rotating motor and includes a first eccentric axis offset from a rotary axis of the spindle rotating motor;
a connecting support plate that is connected to the first eccentric axis, the connecting plate being configured over the plurality of nozzle spindles; and
a plurality of spindle crank arms including a second eccentric axis connected to the connecting support plate, each spindle crank arm of the plurality being connected to a nozzle spindle of the plurality of nozzle spindles.

13. A head assembly for a chip mounter comprising:
a housing including a first plurality of spindle receiving holes and a second plurality of spindle receiving holes;
a first plurality of nozzle spindles configured in the first plurality of spindle receiving holes for vertical and rotational movement, each of the first plurality of nozzle spindles including a nozzle for picking up and mounting electronic components;
a second plurality of nozzle spindles configured in the second plurality of spindle receiving holes for vertical and rotational movement, each of the second plurality of nozzle spindles including a nozzle for picking up and mounting electronic components;
a first selection member configured to select at least one nozzle spindle of the first and second plurality of nozzle spindles for vertical movement;
a second selection member configured to select at least one nozzle spindle of the first and second plurality of nozzle spindles for vertical movement;
at least one horizontal driver coupled with the first and second selection member, the at least one horizontal driver moving the first and second selection members in a plane above the first and second plurality of nozzle spindles; and
an elevating driver simultaneously moving the first and second selection members vertically.

14. The head assembly of claim 13, wherein at least one of the first and second plurality of nozzle spindles is configured so that at least one of the first and second selection members may be oriented by the horizontal driver for selecting no nozzle spindle for vertical movement.

15. The head assembly of claim 14, wherein each of the first and second plurality of nozzle spindles includes two front and two rear nozzle spindles, and
wherein the at least one horizontal driver is configured to independently move the first and second selection members such that each of the first and second selection members is operative to select no nozzle spindle, one nozzle spindle, the two front nozzle spindles, and the two rear nozzle spindles.

16. The head assembly of claim 15, wherein the two front nozzle spindles of the first plurality of nozzle spindles are separated from the two rear nozzle spindles of the first plurality of nozzle spindles by a first distance greater than a portion of the first selection member; and
wherein the two front nozzle spindles of the second plurality of nozzle spindles are separated from the two rear nozzle spindles of the second plurality of nozzle spindles by a second distance greater than a portion of the second selection member.

17. The head assembly of claim 15, wherein the two front nozzle spindles and two rear nozzle spindles of the first plurality of nozzle spindles are separated by a first horizontal distance substantially similar to a distance between a first set of two adjacent parallel component feeders that supply electronic components to be picked up; and
wherein the two front nozzle spindles and two rear nozzle spindles of the second plurality of nozzle spindles are separated by a second horizontal distance substantially similar to a distance between a second set of two adjacent parallel component feeders that supply electronic components to be picked up.

18. The head assembly of claim 17, wherein the first horizontal distance is substantially similar to the second horizontal distance.

19. The head assembly of claim 13, wherein the first and second selection members each comprise:
a combining portion that is rotatably and vertically coupled with the at least one horizontal driver; and
a spindle contacting portion projecting out from the combining portion, the spindle contacting portion configured to select one or more nozzle spindles.

20. The head assembly of claim 19, wherein the elevating driver comprises:

an elevating drive motor; and an elevating member coupled with the elevating drive motor and vertically movable on the housing, the elevating member including a selection member fixing portion configured to receive the combining portion of each of the first and second selection members;

wherein the at least one horizontal driver comprises:

a first horizontal drive motor including a first connecting axis that is connected to an axis of the first horizontal drive motor, the first connecting axis being fitted with the combining portion of the first selection member and extending through the selection member fixing portion;

a second horizontal drive motor including a second connecting axis that is connected to an axis of the second horizontal drive motor, the second connecting axis being fitted with the combining portion of the second selection member and extending through the selection member fixing portion.

21. The head assembly of claim 20, wherein the selection member fixing portion includes a plurality of insert holes into which the combining portions of the first and second selection members are fitted.

22. The head assembly of claim 20, wherein the elevating drive motor is a voice coil motor that is vertically mounted to the housing.

* * * * *